United States Patent
Cowell et al.

(10) Patent No.: US 11,824,556 B1
(45) Date of Patent: Nov. 21, 2023

(54) ERROR CORRECTION USING SOFT DECISION BITS AND MULTIPLE HYPOTHESES

(71) Applicant: SAMSUNG ELECTRONICS CO., LTD., Suwon-si (KR)

(72) Inventors: Michael John Cowell, Cambridge (GB); David Skinner Price, Cambridge (GB)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/873,066

(22) Filed: Jul. 25, 2022

(51) Int. Cl.
H03M 13/00 (2006.01)
H03M 13/11 (2006.01)

(52) U.S. Cl.
CPC .... H03M 13/1111 (2013.01); H03M 13/1108 (2013.01)

(58) Field of Classification Search
CPC .......... H03M 13/1111; H03M 13/1108; H03M 13/2948; H03M 13/45; H03M 13/1128; H03M 13/1105
See application file for complete search history.

(56) References Cited

U.S. PATENT DOCUMENTS

| | | | |
|---|---|---|---|
| 6,704,371 B1 | 3/2004 | Hishiki et al. | |
| 8,255,754 B2 | 8/2012 | Tsfati et al. | |
| 9,385,758 B2 * | 7/2016 | Lim | H03M 13/1111 |
| 9,417,953 B2 * | 8/2016 | Chae | G06F 11/1048 |
| 9,619,327 B2 * | 4/2017 | Ha | H03M 13/2909 |
| 9,729,171 B2 * | 8/2017 | Motwani | H03M 13/45 |
| 9,792,176 B2 * | 10/2017 | Blaichman | G06F 3/0619 |
| 9,798,614 B2 * | 10/2017 | Kim | H03M 13/293 |
| 10,084,481 B2 * | 9/2018 | Sommer | H03M 13/2963 |
| 10,135,464 B2 * | 11/2018 | Wang | H03M 13/1108 |
| 10,298,360 B2 | 5/2019 | Kim et al. | |
| 10,476,529 B2 | 11/2019 | Cha et al. | |
| 10,484,020 B2 * | 11/2019 | Bhatia | H03M 13/3977 |

(Continued)

FOREIGN PATENT DOCUMENTS

JP 6668588 3/2020

OTHER PUBLICATIONS

Shahram Babaie et al., "Double Bits Error Correction Using CRC Method", 2009 Fifth International Conference on Semantics, Knowledge and Grid, 2009 IEEE Computer Society, pp. 254-257.

(Continued)

*Primary Examiner* — Esaw T Abraham
(74) *Attorney, Agent, or Firm* — F. Chau & Associates, LLC (57) ABSTRACT

An apparatus and method for error correction based on soft decision bits and multiple hypotheses includes: maintaining a plurality of previous single bit-flip hypotheses, each hypothesis including a respective bit-flip, a respective pre-flip bit confidence, and a respective hash responsive to the respective bit-flip; receiving a bit and a corresponding bit confidence; comparing the received bit confidence with a highest pre-flip bit confidence of the maintained plurality of single bit-flip hypotheses; and if the received bit confidence is less than the highest pre-flip bit confidence, forming a new single bit-flip hypothesis and replacing a prior bit-flip hypothesis having the highest pre-flip bit confidence with the new hypothesis.

11 Claims, 9 Drawing Sheets

(56) References Cited

U.S. PATENT DOCUMENTS 10,841,039 B2 * 11/2020 Hoermaier ............ H04L 1/0041
2021/0058190 A1 2/2021 Zopf

OTHER PUBLICATIONS

Nghia Doan et al., "Neural Belief Propagation Decoding of CRC-Polar Concatenated Codes", Oct. 31, 2018.
Bill McDaniel, "An Algorithm for Error Correcting Cyclic Redundance Checks", Jun. 1, 2003; http://www.drdobbs.com/an-algorithm-for-error-correcting-cyclic/184401662.
Wei An et al., "CRC Codes as Error Correction Codes", Apr. 28, 2021.

* cited by examiner

ERROR CORRECTION USING SOFT DECISION BITS AND MULTIPLE HYPOTHESES

FIELD

Embodiments of the present disclosure relate to communications technologies, and more particularly relate to error correction using soft decision bits and multiple hypotheses suitable for low-latency wireless communications.

DISCUSSION

Although Cyclic Redundancy Code (CRC) data in Bluetooth® (formerly IEEE 802.15.1) and WiFi™ (currently IEEE 802.11) wireless communications packets has existed primarily to detect errors, CRC and like encoding may also be used to correct errors. This may be particularly useful in Bluetooth® wireless communications, for example, where some data rates such as Enhanced Data Rate (EDR) using π/4-DPSK (EDR2) and/or 8-DPSK (EDR3) schemes, or Low Energy (LE) using ½ mega-bits per second (LE ½ mbps) schemes, may be otherwise uncoded or have no other redundancy.

SUMMARY

A method embodiment for error correction based on soft decision bits and multiple hypotheses includes: maintaining a plurality of previous single bit-flip hypotheses, each hypothesis including a respective bit-flip, a respective pre-flip bit confidence, and a respective hash responsive to the respective bit-flip; receiving a bit and a corresponding bit confidence; comparing the received bit confidence with a highest pre-flip bit confidence of the maintained plurality of single bit-flip hypotheses; and if the received bit confidence is less than the highest pre-flip bit confidence, forming a new single bit-flip hypothesis and replacing a prior bit-flip hypothesis having the highest pre-flip bit confidence with the new hypothesis.

A method embodiment may further include: updating a previous hard decoding hash based on the received bit to form a current hard decoding hash; and updating a plurality of previous single bit-flip hypotheses hashes based on the received bit to form a plurality of current bit-flip hypotheses hashes.

A method embodiment may further include: forming a new single bit-flip hypothesis hash based on a previous hard decoding hash and the current bit-flip.

A method embodiment may be applied where the number of maintained bit-flip hypotheses is less than an expected number of bits in a packet, and may further include: checking whether the packet is complete, and if not, repeating the steps of maintaining, receiving, comparing, forming, replacing, updating a previous hard decoding hash, and updating a plurality of previous single bit-flip hypotheses hashes.

A method embodiment may be applied where the number of maintained bit-flip hypotheses is less than an expected number of bits in a packet, and may further include: checking whether the packet is complete, and if so, checking if the hard decoding hash is substantially zero, and if so, selecting the packet corresponding to the hard decoding hash without any bit-flip corrections.

A method embodiment may be applied where the number of maintained bit-flip hypotheses is less than an expected number of bits in a packet, and may further include: checking whether the packet is complete, and if so, checking if the hard decoding hash is substantially zero, and if not, checking if any of the hashes of the plurality of single bit-flip hypotheses is substantially zero, and if so, selecting the packet corresponding to the one of the hashes of the plurality of single bit-flip hypotheses that is zero to make a single bit-flip correction.

A method embodiment may be applied where the number of maintained bit-flip hypotheses is less than an expected number of bits in a packet, and may further include: checking whether the packet is complete, and if so, checking if the hard decoding hash is substantially zero, and if not, checking if any of the hashes of the plurality of single bit-flip hypotheses is substantially zero, and if not, computing at least one affine combination of the plurality of bit-flip hypotheses hashes to make corrections to multiple bit-flip errors based on the plurality of hypotheses.

A method embodiment may further include: computing at least one affine combination from the plurality of bit-flip hypotheses hashes to make corrections to multiple bit-flip errors based on at least two of the plurality of hypotheses.

A method embodiment may further include: computing a plurality of affine combinations from the plurality of bit-flip hypotheses hashes to make corrections to multiple bit-flip errors based on all of the plurality of hypotheses.

A method embodiment may be applied where the number of correctable bit-flip errors is equal to the number of the plurality of hypotheses.

An error correction apparatus embodiment is configured to receive a plurality of packets, each packet including a plurality of symbols, and each symbol including a plurality of bits, and correct at least one flipped bit based on soft decision bits and multiple hypotheses, the apparatus including: a hard decoding block configured to receive a plurality of bits of a current symbol and compute a first hash of the bits, where the hard decoding block includes an input buffer and a first hash circuit connected to the input buffer; and a soft decoding block configured to receive the same plurality of bits, invert an incoming bit, and compute at least one second hash of the bits including the inverted incoming bit, where the soft decoding block includes an inverter connected to the input buffer, a second hash circuit connected to the first hash circuit and the inverter, a tracking array connected to the input buffer, a frame tracking circuit connected to the tracking array, a soft decision circuit connected to the frame tracking circuit, a weak bit search circuit connected to the frame tracking circuit and the tracking array, and a symbol counter connected to the tracking array.

An error correction apparatus embodiment may be applied where the first hash circuit is configured to provide an intermediate hash state to the second hash circuit.

An error correction apparatus embodiment may be applied where the first hash circuit is configured to provide an intermediate hash state to the second hash circuit, where the second hash circuit is configured to use the intermediate hash state for the current symbol, step that forward by one bit at a time to the incoming bit position, and calculate a second hash responsive to the inverted incoming bit.

An error correction apparatus may be applied where the tracking array is configured to store a plurality of single-bit hypotheses hashes, read a stored hash from each element of the array, progress each read hash on each incoming bit, and overwrite each stored hash in the array with each progressed hash, respectively.

An error correction apparatus may be applied where the frame tracking circuit is configured to track the confidence levels in each of a plurality of bits in the current symbol.

An error correction apparatus may be applied where the frame tracking circuit is configured to track the confidence levels in each of a plurality of bits in the current symbol over frame boundaries to which each respective hash is calculated.

An error correction apparatus may be applied where the weak bit search circuit is configured to check, in between symbol bits, whether a current soft decision bit is weaker than any in the tracking array, and if so, replace the strongest soft decision bit with the current soft decision bit.

An error correction apparatus may be applied where the hard decoding block is configured to check, at the end of a packet, if the first hash is zero, and if so, make no corrections to the received packet.

An error correction apparatus may be applied where the tracking array is configured to check, at the end of a packet, if any of the single-bit hypotheses hash elements in the tracking array is zero, and if so, make a correction by inverting a flipped bit indicated by a bit position field of that element.

An error correction apparatus may be applied where the tracking array is configured to check, at the end of a packet, if any of the single-bit hypotheses hash elements in the tracking array is zero, and if not, make a plurality of corrections by computing at least one affine combination of the array hashes to correct a plurality of flipped bits based on the plurality of hashes.

An error correction system embodiment is configured to receive packets, each packet including symbols, and each symbol including bits, and to correct at least one flipped bit based on soft decision bits and multiple hypotheses, the system including: a hard decoding block configured to receive bits of a current symbol and compute a first hash of the bits, wherein the hard decoding block includes an input buffer and a first hash circuit connected to the input buffer; and a soft decoding block configured to receive the same bits, invert an incoming bit, and compute at least one second hash of the bits including the inverted incoming bit, wherein the soft decoding block includes an inverter connected to the input buffer, a second hash circuit connected to the first hash circuit and the inverter, a tracking array connected to the input buffer, a frame tracking circuit connected to the tracking array, a soft decision circuit connected to the frame tracking circuit, a weak bit search circuit connected to the frame tracking circuit and the tracking array, and a symbol counter connected to the tracking array, wherein the tracking array is configured to store single-bit hypotheses hashes, read a stored hash from each element of the array, progress each read hash on each incoming bit, overwrite each stored hash in the array with each progressed hash, respectively, check, at the end of a packet, if any of the single-bit hypotheses hash elements in the tracking array is zero, and if not, make corrections by computing at least one affine combination of the array hashes to correct flipped bits based on the hashes, wherein the at least one affine combination of the array hashes is a linear combination of the array of hashes.

BRIEF DESCRIPTION OF THE DRAWINGS

Embodiments of the present disclosure may become more apparent and be better appreciated upon consideration of the following description of embodiments, which are offered as illustrative examples and not for purposes of limitation, when taken in conjunction with the accompanying drawings, in which.

DETAILED DESCRIPTION

Embodiments of the present disclosure may leverage basic error detection codes for on-the-fly hypotheses-based error correction. A wireless communications demodulator may be utilized to provide not only demodulated symbol bits, but also a probability and/or confidence for each demodulated symbol bit. For example, a demodulator may use an error vector magnitude of a symbol versus that of an ideal symbol to derive a confidence estimate for the symbol, without limitation thereto.

One approach to correcting symbol bit errors might include the use of linear algebraic techniques to find candidate error bits. The use of linear algebra might require large numbers of computations, and significantly increase circuit area, power consumption and/or reception latency. Another approach to correcting symbol bit errors may include the use of soft decision bits and multiple on-the-fly hypotheses in a real-time wireless channel.

Embodiments of the present disclosure provide a method and apparatus for Cyclic Redundancy Code (CRC) or like error detection code based symbol bit error correction using soft decision bits and multiple hypotheses in a communications channel, such as in, but not limited to, a Bluetooth® Classic (BR/EDR), Bluetooth® Low Energy (LE), or WiFi™ wireless communications channel.

Figure 1:
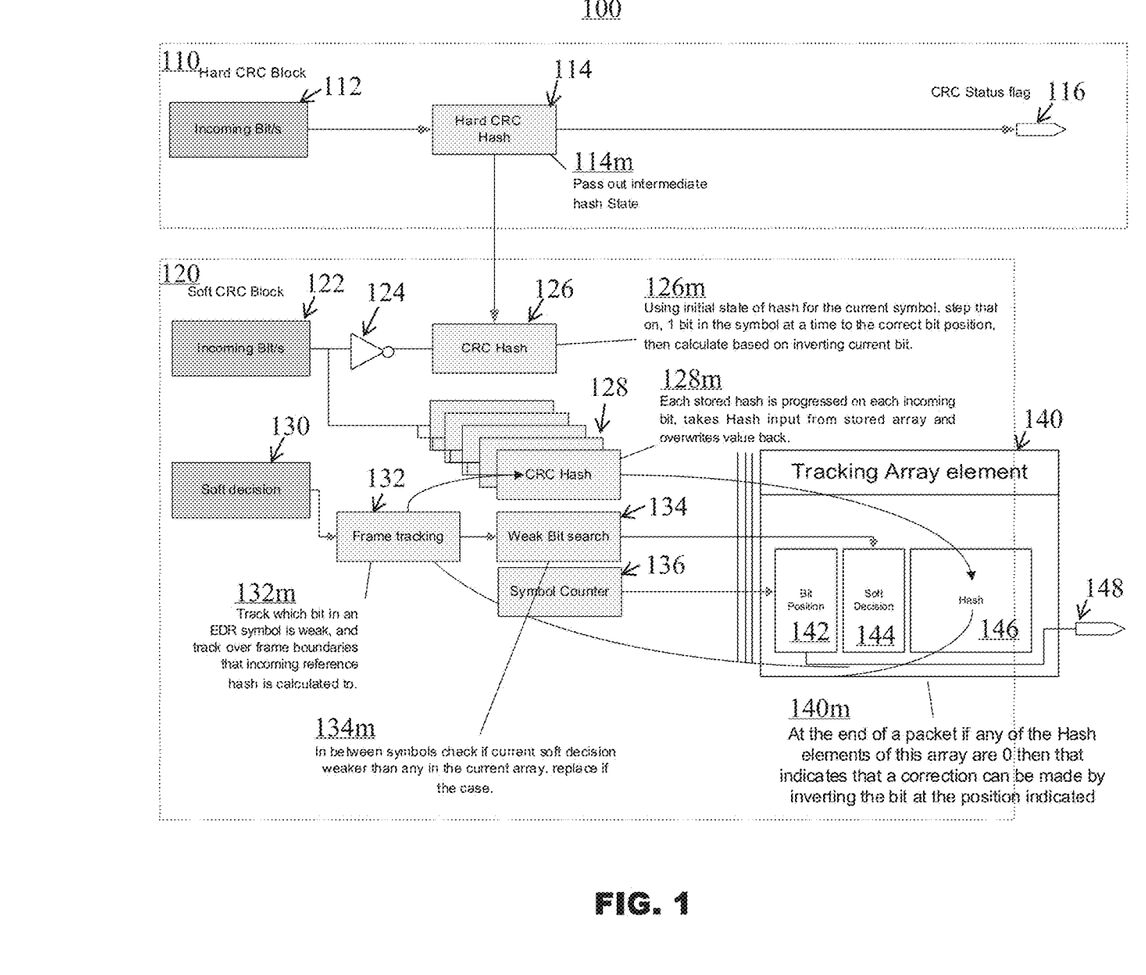
FIG. 1 is a hybrid block diagram illustrating a system for Cyclic Redundancy Code (CRC) error correction using soft decision bits and multiple hypotheses in accordance with an embodiment of the present disclosure.

As shown in FIG. 1, a system for error correction using soft decision bits and multiple hypotheses is indicated generally by the reference numeral 100. The system 100 includes a hard CRC block 110 and a soft CRC block 120.

The hard CRC block 110 includes an incoming data bit buffer 112 connected to a hard CRC hash circuit 114, which passes out an intermediate hash state at step 114m. The hard CRC hash circuit 114 is connected to a CRC status flag line or register 116, which may be indicative of whether or not the incoming data passed the hard CRC check.

The soft CRC block 120 includes an incoming data bit buffer 122 connected to an inverter 124, which, in turn, is connected to a soft CRC hash circuit 124. The soft CRC hash circuit 124 receives the intermediate hash state from the hard CRC hash circuit 114, and using the initial state of the hash for the current symbol, steps that forward by one symbol bit at a time to the current bit position, and then calculates a soft CRC hash based on the inverted current bit at step 126m.

The soft CRC block 120 further includes a CRC hash array 128 including N CRC hash fields. The CRC hash array is connected directly to the incoming data bit buffer 122 bypassing the inverter. Each stored hash field is progressed on each incoming bit by reading the respective hash field input from the stored array, updating the read hash field responsive to the latest non-inverted incoming bit, and then writing it back to its respective field in the array at step 128m.

In addition, the soft CRC block 120 further includes soft decision logic 130 connected to a frame tracking circuit 132, which tracks which bit in an EDR symbol, for example, is weak, and tracks over frame boundaries to which the incoming reference hash has been calculated at step 132m. The frame tracking circuit 132, in turn, is connected to a weak bit search circuit 134. In between symbols, the weak bit search circuit 134 checks whether the current soft decision is weaker than any in the current array, and, if so, replaces the strongest with it.

Each tracking array element 140 of N such elements is tracked by the frame tracking circuit 132, and includes a bit position 142 provided by a symbol counter 136, a soft decision 144 provided by the weak but search circuit 134, and a hash provided by the CRC hash array 128. If any of the hash elements of this array are zero at the end of a packet at step 140m, then that indicates that a correction may be made by inverting the bit at the position indicted by the bit position 142, which is then provided to a flipped bit position bus or register 148.

Figure 2:
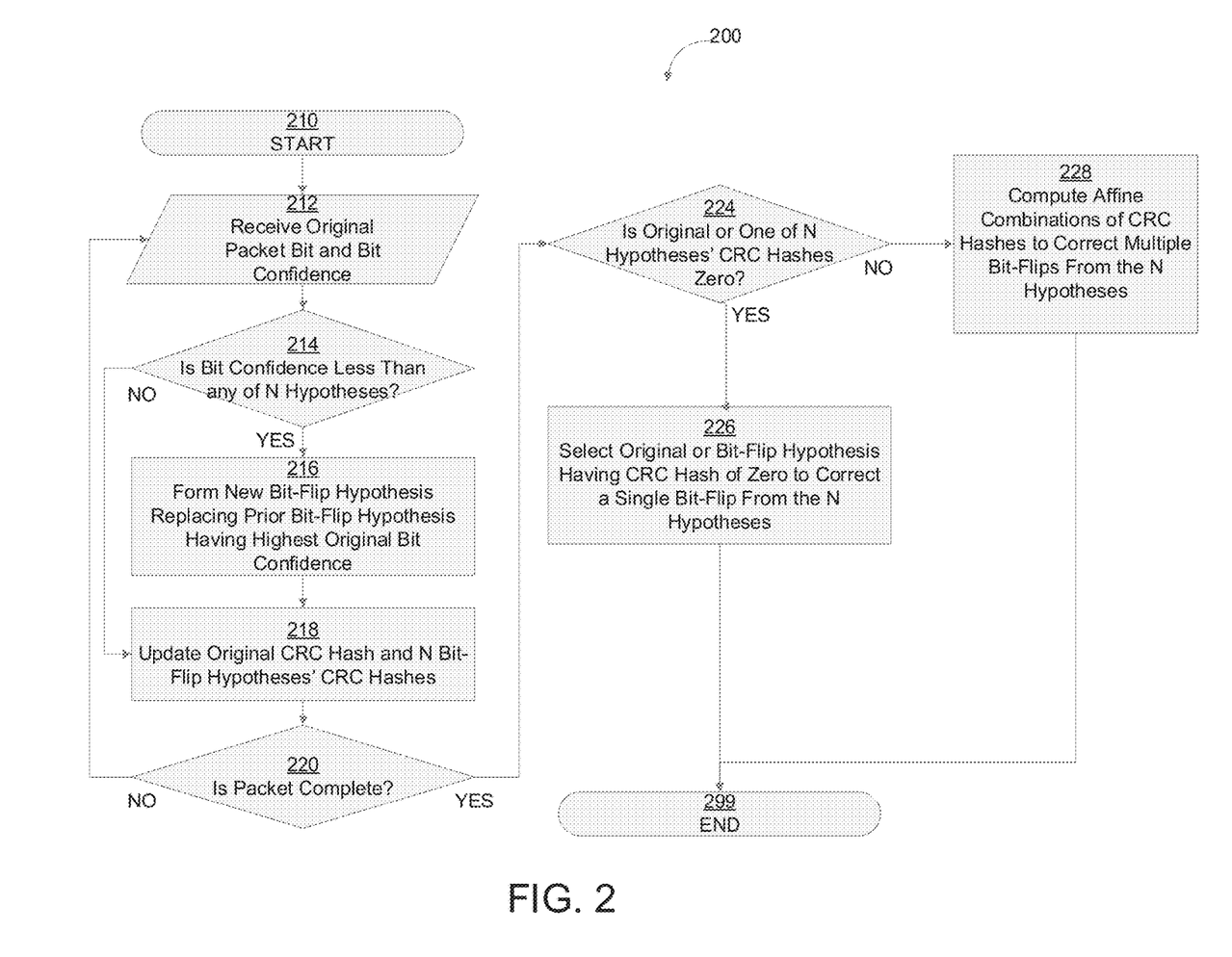
FIG. 2 is a flowchart diagram illustrating a method for CRC error correction using soft decision bits and multiple hypotheses in accordance with an embodiment of the present disclosure.

Turning to FIG. 2, a method for CRC error correction using soft bits and multiple hypotheses is indicated generally by the reference numeral 200. A start block 210 passes control to an input block 212, which receives an original packet bit and a bit confidence, such as from a CRC demodulator, and passes control to a decision block 214. The decision block 214 determines whether the received bit confidence is less than any of N hypotheses, and if so passes control to a function block 216, but if not passes control to a function block 218. The function block 216 forms a new bit-flip hypothesis on-the-fly, uses it to replace the prior bit-flip hypothesis having the highest original bit confidence, and passes control to the function block 218.

The function block 218 updates the hard CRC hash as well as all N remaining bit-flip hypotheses' CRC hashes, and passes control to a decision block 220. The decision block 220 determines whether the packet is complete, and if not, passes control back to the input block 212. But if the packet is complete, it passes control to another decision block 224.

The decision block 224 determines whether the hard CRC hash or one of the N hypotheses' CRC hashes is zero, and if so passes control to a function block 226, but if not passes control to a function block 228. If one of the hashes is zero, the function block 226 selects the original or the bit-flip hypothesis having the CRC hash of zero to correct a single bit-flip from the N hypotheses, and passes control to an end block 299. Or, if none of the hashes is zero, the function block 228 computes affine combinations of CRC hashes to correct multiple bit-flips from the N hypotheses, and then passes control to the end block 299.

Each affine combination is a linear combination of elements of an affine space over a field. The set of all affine combinations of a set of points form the smallest subspace containing the points. The affine combinations commute with any affine transformation. In particular, any affine combination of the fixed points of a given affine transformation is also a fixed point of that affine transformation, so the set of fixed points of that affine transformation forms an affine subspace. When a stochastic matrix acts on a column vector, the result is a column vector whose entries are affine combinations of the column vector with coefficients from the rows in the stochastic matrix.

At step 228 of FIG. 2, assuming a contrived simplified example for purposes of explanation, without limitation thereto, three (N=3) hypothetical bit-flip CRC hash vectors might be stored as:

Hash[0]=00000000000000000000000000000001
Hash[1]=00000000000000000000000000000010
Hash[2]=00000000000000000000000000000100

After the 1st hypothesis, the affine combinations of potential bit-flip hashes may be computed as:

MultiHash[0]=00000000000000000000000000000000
MultiHash[1]=Hash[0]
MultiHash[2]=00000000000000000000000000000000
MultiHash[3]=Hash[0]
MultiHash[4]=00000000000000000000000000000000
MultiHash[5]=Hash[0]
MultiHash[6]=00000000000000000000000000000000
MultiHash[7]=Hash[0]

After the 2nd hypothesis, with "^" indicating the bitwise Exclusive-OR operator, the affine combinations of potential bit-flip hashes may be computed as:

MultiHash[0]=00000000000000000000000000000000
MultiHash[1]=Hash[0]
MultiHash[2]=Hash[1]
MultiHash[3]=Hash[0]^ Hash[1]
MultiHash[4]=00000000000000000000000000000000
MultiHash[5]=Hash[0]
MultiHash[6]=Hash[1]
MultiHash[7]=Hash[0]^ Hash[1]

After the 3rd hypothesis, the affine combinations of potential bit-flip hashes may be computed as:

MultiHash[0]=00000000000000000000000000000000
MultiHash[1]=Hash[0]= 00000000000000000000000000000001
MultiHash[2]=Hash[1]= 00000000000000000000000000000010
MultiHash[3]=Hash[0]^ Hash[1]= 00000000000000000000000000000011
MultiHash[4]=Hash[2]= 00000000000000000000000000000100
MultiHash[5]=Hash[0]^ Hash[2]= 00000000000000000000000000000101
MultiHash[6]=Hash[1]^ Hash[2]= 00000000000000000000000000000110
MultiHash[7]=Hash[0]^ Hash[1]^ Hash[2]= 00000000000000000000000000000111

In operation, referring to FIGS. 1 and 2 together, an embodiment of the present disclosure tracks the N least probable bits in a packet, and stores a calculation of what the CRC would have been with each of these bits inverted. This may be done on-the-fly in real-time, as the packet is being received, at the modest cost of N extra stored CRCs. Additionally, the final set of CRC calculations allows a fix based on any combination of the N least probable bits being inverted.

Using this method, an array of N fields may be held, where the fields are each firstly a CRC calculated with the current bit inverted, then a probability and finally a bit position; where these fields are filled up inline as the bitstream arrives and the raw bitstream CRC is also stored. After the first N bits of the packet, a CRC will be held based upon the unaltered received packet and then a full array of N fields each containing a CRC of bits 1 to N of the incoming packet where one weak bit has been inverted. As the remaining bits of the packet are processed, the probability of each incoming bit is compared to those in the array, and wherever the new incoming bit is weaker, then a new CRC is calculated with just that bit inverted and replacing the strongest in the array. Since the array holds the raw CRC of the incoming bitstream, this method never has to store all bits and recall them in order to 'recalculate a CRC' with a bit inverted, because that information is already stored to maintain the CRC of the unchanged bits up to the current received bit, and then the method can simply process that CRC to include the latest inverted bit. On each bit received, each CRC in the array is updated with the new incoming bit, hence the CRC calculation system is essentially shared and the cost is merely the array storage and control state machine.

At the end of the packet, there will be N+1 CRCs, one of the incoming packet and then N each with an individual bit inverted. If any of the N CRC engines indicates a success, the packet can be received with the appropriate bit flipped and with no extra latency. The bit position of the bit to invert can be used to modify the data wherever it is stored, either by hardware or reporting to software. Further to this, the CRC is an affine function, and so as these N calculated CRCs are held, the method can also detect a packet fix via any arbitrary combination of these N bits, such as with $2^N$ XORs of the already stored CRCs. If any of these combinations of the CRCs indicates a match, then this match can be achieved by inverting the bit positions recorded in the array for that match.

Using this method with N=5, for example, the receiver sensitivity of a Bluetooth® receiver may be increased by 1.5 dB. The extra circuits for the CRC tracking and storage may add less than 1% to the receiver area while the extra power may be similarly negligible, but the quality of communications or user experience may be optimized.

Figure 3:
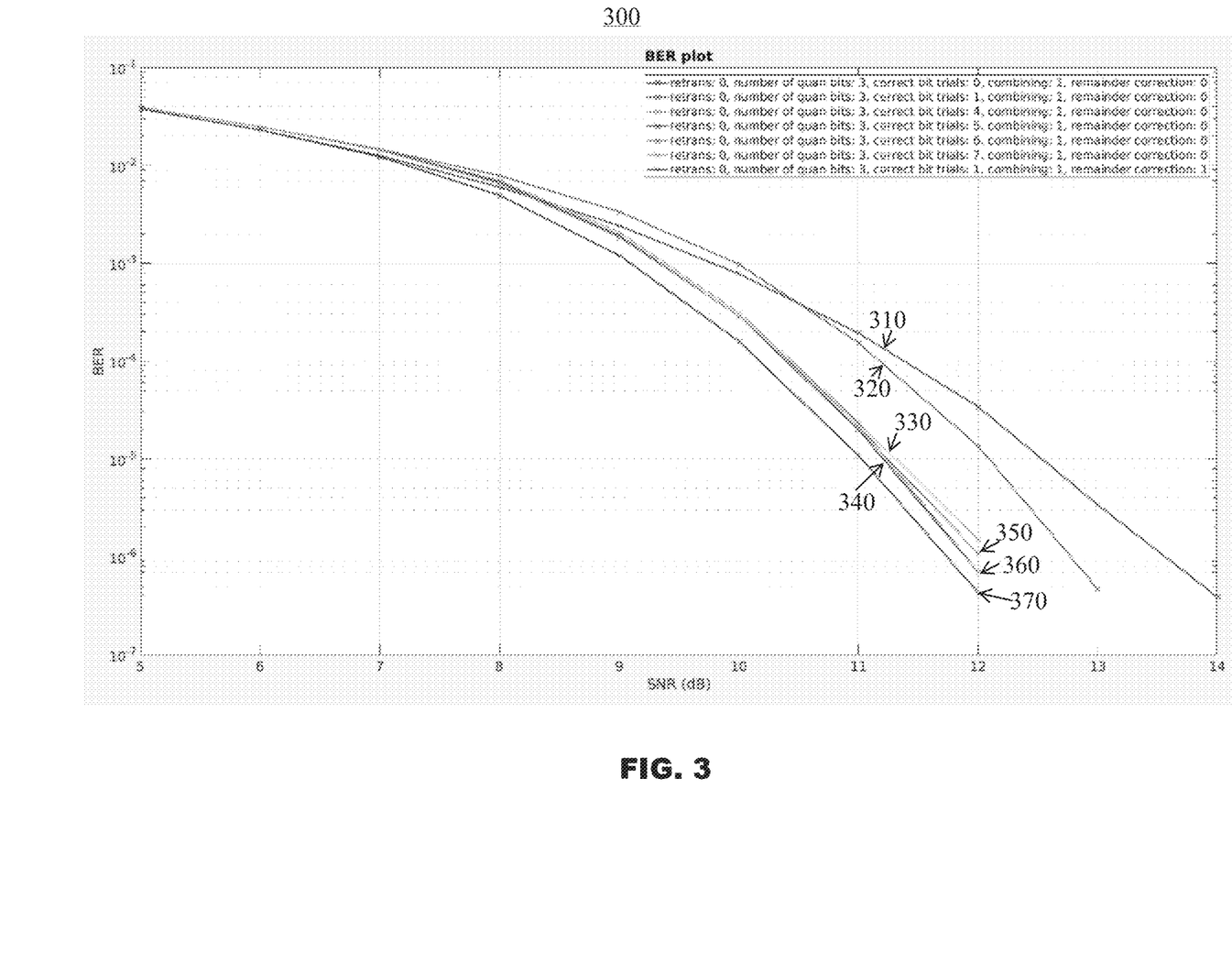
FIG. 3 is a comparative graphical diagram illustrating performance gains as Bit Error Rate (BER) versus Signal-to-Noise Ratio (SNR) for CRC-based bit correction in accordance with an embodiment of the present disclosure.

Turning now to FIG. 3, comparative performance plots showing bit error rate (BER) between CRC hypotheses-based single bit corrections versus a more costly CRC remainder-based single bit correction are indicated generally by the reference numeral 300. A plot 310 shows a first hypotheses-based single bit correction performance with 0 retransmissions, 3 quantitative bits, 0 corrective bit trials, 1 combining step, and 0 remainder corrections. A plot 320 shows a second hypotheses-based single bit correction performance with 0 retransmissions, 3 quantitative bits, 1 corrective bit trials, 1 combining step, and 0 remainder corrections. A plot 330 shows a third hypotheses-based single bit correction performance with 0 retransmissions, 3 quantitative bits, 4 corrective bit trials, 1 combining step, and 0 remainder corrections. A plot 340 shows a fourth hypotheses-based single bit correction performance with 0 retransmissions, 3 quantitative bits, 5 corrective bit trials, 1 combining step, and 0 remainder corrections. A plot 350 shows a first hypotheses-based single bit correction performance with 0 retransmissions, 3 quantitative bits, 6 corrective bit trials, 1 combining step, and 0 remainder corrections. A plot 360 shows a sixth hypotheses-based single bit correction performance with 0 retransmissions, 3 quantitative bits, 7 corrective bit trials, 1 combining step, and 0 remainder corrections. A plot 370 shows a remainder-based single bit correction performance with 0 retransmissions, 3 quantitative bits, 1 corrective bit trials, 1 combining step, and 1 remainder corrections.

This shows that having four or more trials or attempts for CRC hypotheses-based single bit correction brought the performance gap down to a fraction of a dB from the more costly CRC remainder-based single bit correction.

Figure 4:
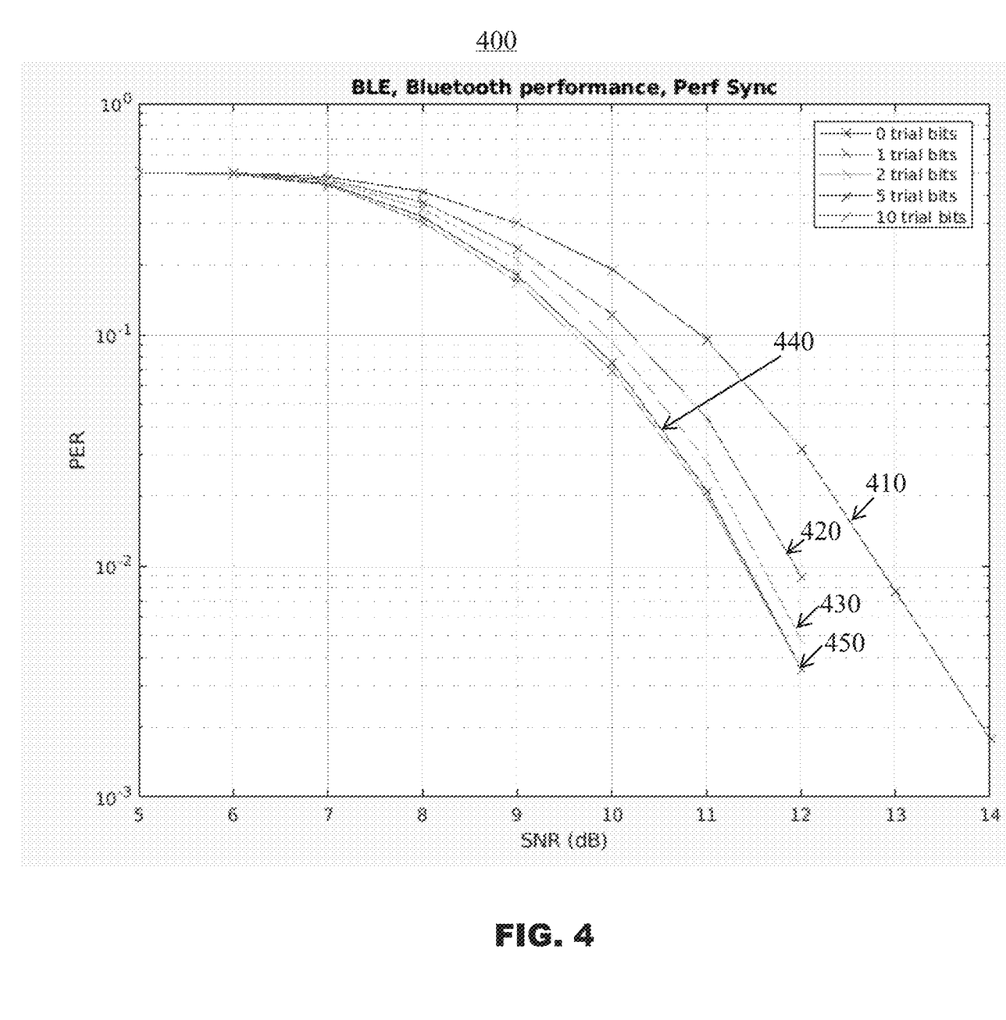
FIG. 4 is a comparative graphical diagram illustrating performance gains as Packet Error Rate (PER) versus SNR for CRC-based bit correction in accordance with an embodiment of the present disclosure.

As shown in FIG. 4, comparative gain plots of Packet Error Rate (PER) versus SNR for CRC hypotheses-based bit correction are indicated generally by the reference numeral 400. A plot 410 shows the results for 0 trial bits. A plot 420 shows the results for 1 trial bits. A plot 430 shows the results for 2 trial bits. A plot 440 shows the results for 5 trial bits. And a plot 450 shows the results for 10 trial bits. Together, these plots show the PER gain of using CRC hypotheses-based bit correction to correct bit errors, as well as the diminished gain when more than 5 or so trials are performed for bit correction.

Figure 5:
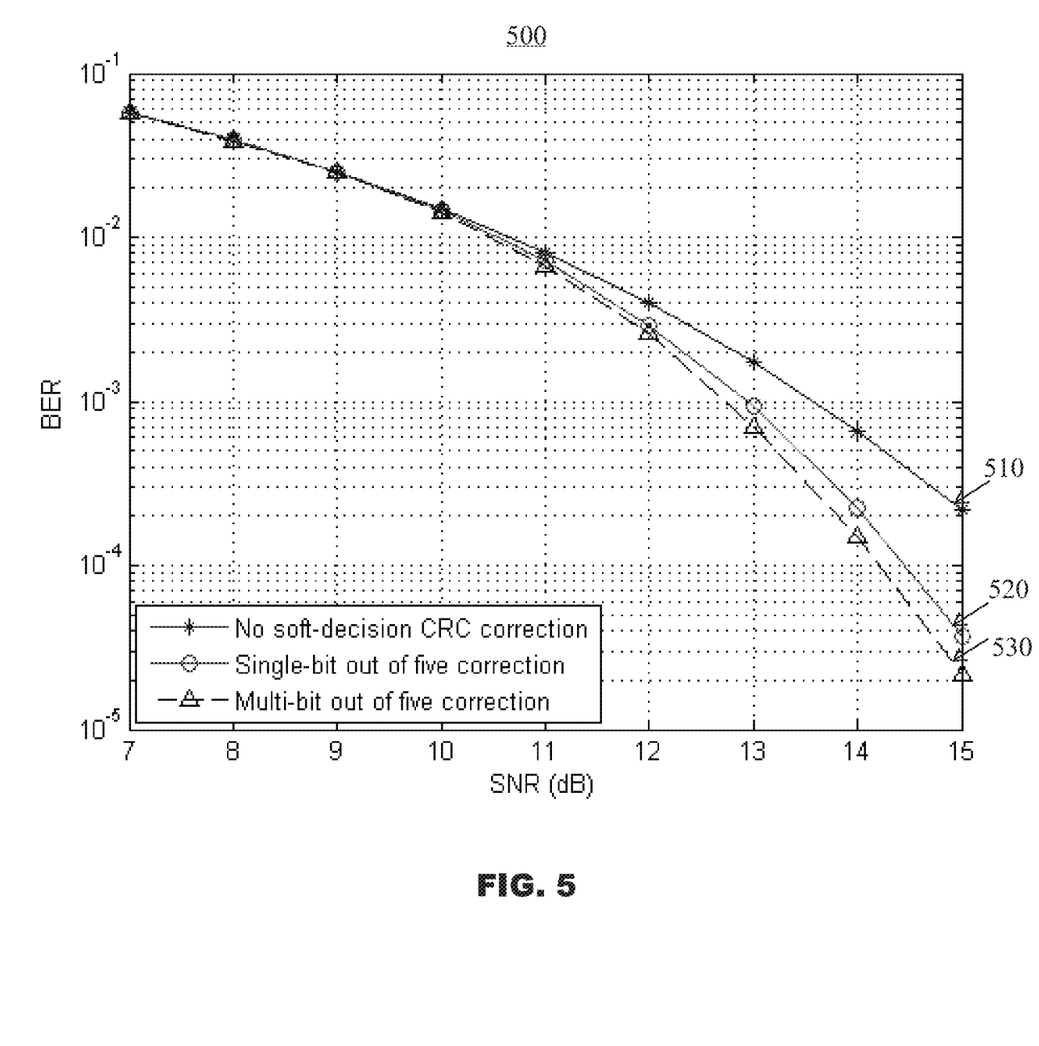
FIG. 5 is a comparative graphical diagram illustrating performance gains from multi-bit corrections as BER versus SNR for CRC-based bit correction in accordance with an embodiment of the present disclosure.

Turning to FIG. 5, comparative plots showing gains from multi-bit corrections as BER versus SNR for CRC-based bit correction are indicated generally by the reference numeral 500. A plot 510 shows results for no soft-decision CRC correction. A plot 520 shows results for a single bit out of five (5) correction. And a plot 530 shows results for multiple bits out of five (5) correction. Together, the comparative plots 500 show a performance gain from the multi-bit corrections, based on a 28 byte Decision-Hypotheses (DH) single-bit correction (DH1) packet.

Figure 6:
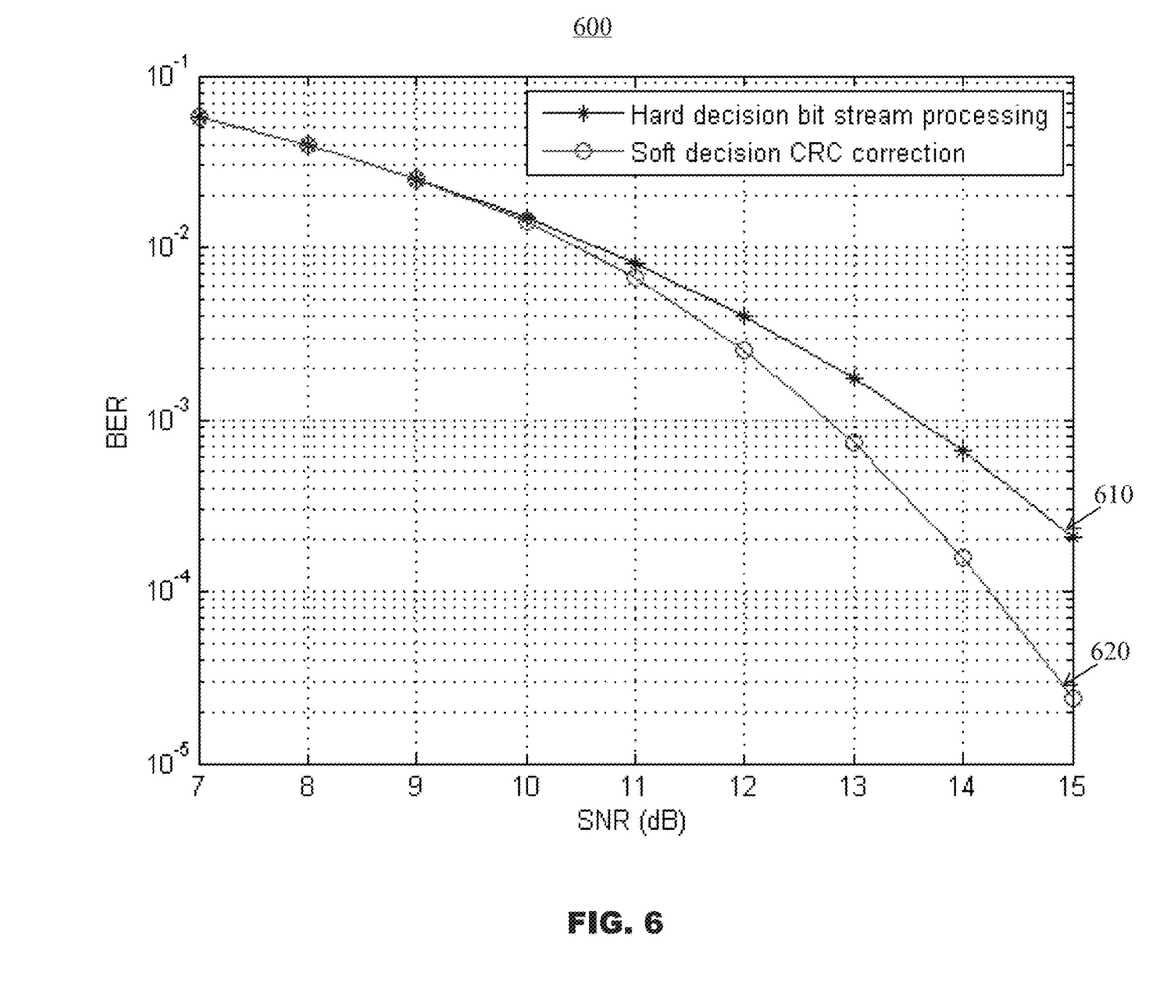
FIG. 6 is a comparative graphical diagram illustrating performance gains or returns with a first short packet as BER versus SNR for CRC-based bit correction in accordance with an embodiment of the present disclosure.

Turning now to FIG. 6, comparative plots showing performance returns with a first short packet as BER versus SNR comparisons for CRC-based bit correction are indicated generally by the reference numeral 600. A first plot 610 shows results for hard-decision bit-stream processing. A second plot 620 shows results for soft-decision CRC correction. These results are for a short packet example of DH1 with a 27 byte payload.

Figure 7:
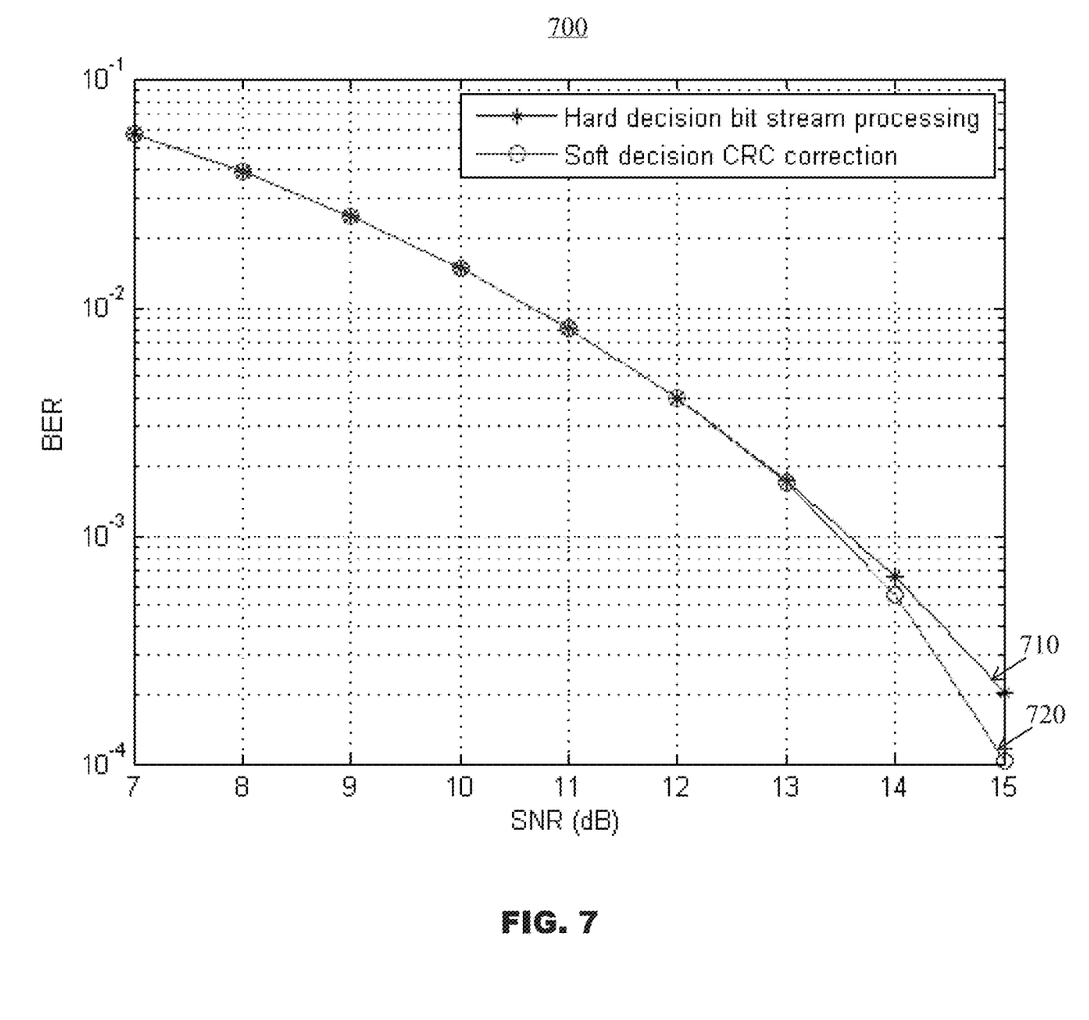
FIG. 7 is a comparative graphical diagram illustrating performance gains or returns with a first long packet as BER versus SNR for CRC-based bit correction in accordance with an embodiment of the present disclosure.

As shown in FIG. 7, comparative plots showing performance returns with a first long packet as BER versus SNR comparisons for CRC-based bit correction are indicated generally by the reference numeral 700. A first plot 710 shows results for hard-decision bit-stream processing. A second plot 720 shows results for soft-decision CRC correction. These results are for a long packet example of DH5 with a 339 byte payload.

A comparison of FIGS. 6 and 7 shows increased performance returns when faced with shorter packets or diminished returns when faced with longer packets, such as when the number of corrections (N) is fixed at 5 for Decision-Hypotheses (DH)-based symbol error correction, without limitation thereto.

Figure 8:
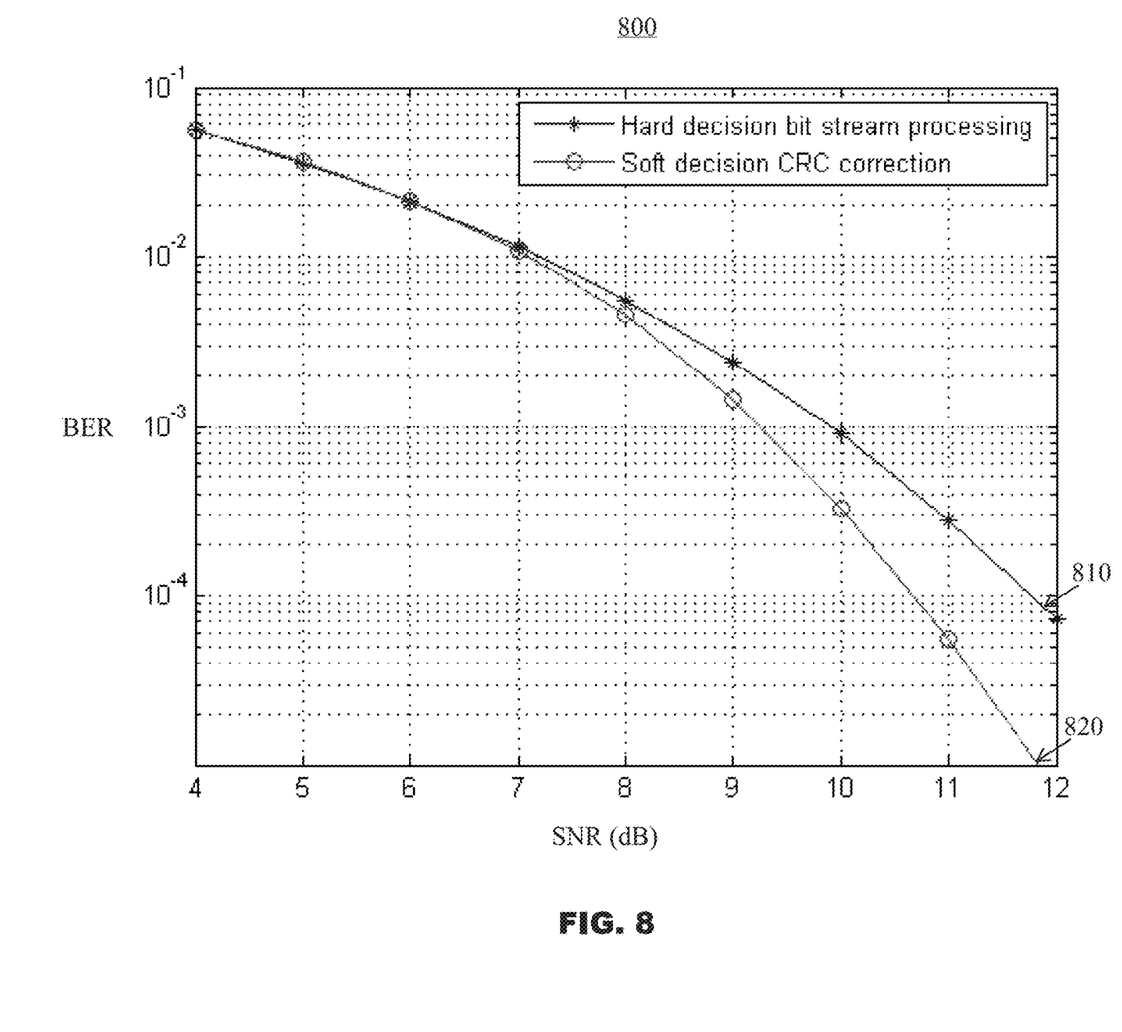
FIG. 8 is a comparative graphical diagram illustrating performance gains or returns with a second short packet as BER versus SNR for CRC-based bit correction in accordance with an embodiment of the present disclosure.

Turning to FIG. 8, comparative plots showing performance returns with a second short packet as BER versus SNR comparisons for CRC-based bit correction are indicated generally by the reference numeral 800. A first plot 810 shows results for hard-decision bit-stream processing. A second plot 820 shows results for soft-decision CRC correction. These results are for a short packet example of LE Uncoded 1M PHY with a 37 byte payload.

Figure 9:
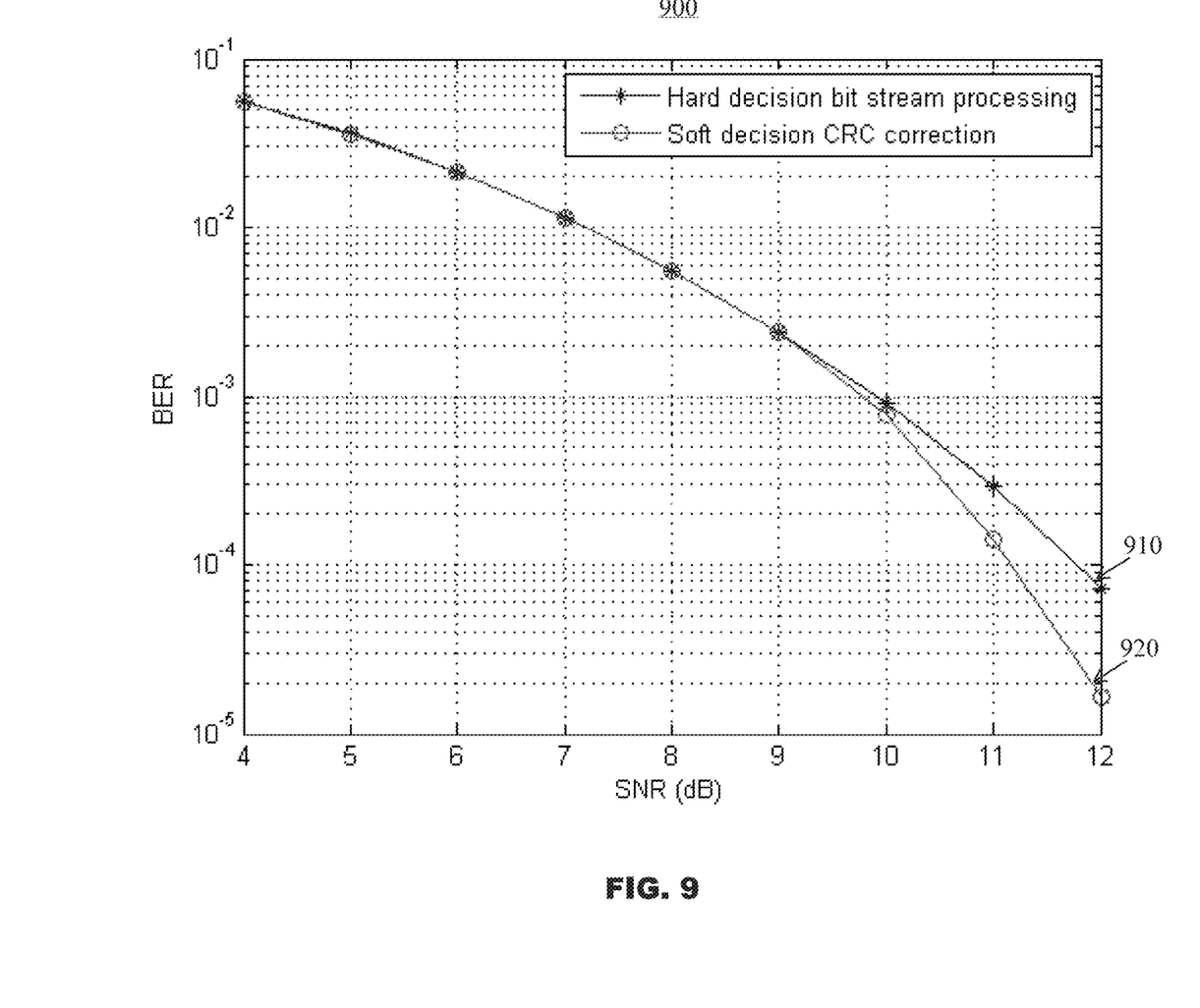
FIG. 9 is a comparative graphical diagram illustrating performance gains or returns with a second long packet as BER versus SNR for CRC-based bit correction in accordance with an embodiment of the present disclosure.

Turning now to FIG. 9, comparative plots showing performance returns with a second long packet as BER versus SNR comparisons for CRC-based bit correction are indicated generally by the reference numeral 900. A first plot 910 shows results for hard-decision bit-stream processing. A second plot 920 shows results for soft-decision CRC correction. These results are for a long packet example of LE Uncoded 1M PHY with a 255 byte payload.

A comparison of FIGS. 8 and 9 shows increased performance returns when faced with shorter packets or diminished returns when faced with longer packets, such as when the number of corrections (N) is fixed at 5 for Low Energy (LE)-based symbol error correction, without limitation thereto.

While exemplary embodiments have been described to operate in Bluetooth® environments, and a preferred embodiment has been described to operate under the Bluetooth® LE SIG standard, the present disclosure is not limited thereto. For example, alternate embodiments of the present disclosure may be configured to operate over any type of Bluetooth®, any type of WiFi™, any combination of Bluetooth® and WiFi™, and/or other wireless communications protocols, channels or environments.

Although exemplary embodiments of the present disclosure have been shown and described, it shall be understood that those of ordinary skill in the pertinent art may make changes therein without departing from the scope, principles, and spirit of the present disclosure as defined by the appended claims and their equivalents.

What is claimed is:

1. An error correction apparatus configured to receive a plurality of packets, each packet comprising a plurality of symbols, and each symbol comprising a plurality of bits, and correct at least one flipped bit based on soft decision bits and multiple hypotheses, the apparatus comprising:
   a hard decoding block configured to receive a plurality of bits of a current symbol and compute a first hash of the plurality of bits of the current symbol, wherein the hard decoding block includes an input buffer and a first hash circuit connected to the input buffer; and
   a soft decoding block configured to receive the plurality of bits of the current symbol, invert an incoming bit, and compute at least one second hash of the bits including the inverted incoming bit, wherein the soft decoding block includes an inverter connected to the input buffer, a second hash circuit connected to the first hash circuit and the inverter, a tracking array connected to the input buffer, a frame tracking circuit connected to the tracking array, a soft decision circuit connected to the frame tracking circuit, a weak bit search circuit connected to the frame tracking circuit and the tracking array, and a symbol counter connected to the tracking array.

2. The error correction apparatus of claim 1, wherein the first hash circuit is configured to provide an intermediate hash state to the second hash circuit.

3. The error correction apparatus of claim 1, wherein the first hash circuit is configured to provide an intermediate hash state to the second hash circuit , wherein the second hash circuit is configured to use the intermediate hash state for the current symbol, step that forward by one bit at a time to the incoming bit position, and calculate a second hash responsive to the inverted incoming bit.

4. The error correction apparatus of claim 1, wherein the tracking array is configured to store hashes of a plurality of single-bit hypotheses, read a stored hash from each element of the tracking array, progress each read hash on each incoming bit, and overwrite each stored hash in the tracking array with each progressed hash, respectively.

5. The error correction apparatus of claim 4, wherein the tracking array is configured to check, at the end of a packet, if any of hashes of the plurality of single-bit hypotheses in the tracking array is zero, and if so, make a correction by inverting a flipped bit indicated by a bit position field of a single bit-flip hypothesis including hash of zero.

6. The error correction apparatus of claim 4, wherein the tracking array is configured to check, at the end of a packet, if any of hashes of the plurality of single-bit hypotheses in the tracking array is zero, and if not, make a plurality of corrections by computing at least one affine combination of hashes of the tracking array to correct a plurality of flipped bits based on the hashes of the plurality of single-bit hypothesis.

7. The error correction apparatus of claim 1, wherein the frame tracking circuit is configured to track confidence levels in each of a plurality of bits in the current symbol.

8. The error correction apparatus of claim 1, wherein the frame tracking circuit is configured to track confidence levels in each of a plurality of bits in the current symbol over frame boundaries to which each respective hash is calculated.

9. The error correction apparatus of claim 1, wherein the weak bit search circuit is configured to check, in between symbol bits, whether a current soft decision bit is weaker than any in the tracking array, and if so, replace the strongest soft decision bit with the current soft decision bit.

10. The error correction apparatus of claim 1, wherein the hard decoding block is configured to check, at the end of a packet, if the first hash is zero, and if so, make no corrections to the received packet.

11. An error correction system configured to receive a plurality of packets, each packet comprising a plurality of symbols, and each symbol comprising a plurality of bits, and to correct at least one flipped bit based on soft decision bits and multiple hypotheses, the system comprising:
    a hard decoding block configured to receive a plurality of bits of a current symbol and compute a first hash of the plurality of bits of the current symbol, wherein the hard decision block includes an input buffer and a first hash circuit connected to the input buffer; and
    a soft decoding block configured to receive the plurality of bits of the current symbol, invert an incoming bit, and compute at least one second hash of the bits including the inverted incoming bit, wherein the soft decoding block includes an inverter connected to the input buffer, a second hash circuit connected to the first hash circuit and the inverter, a tracking array connected to the input buffer, a frame tracking circuit connected to the tracking array, a soft decision circuit connected to the frame tracking circuit, a weak bit search circuit connected to the frame tracking circuit and the tracking array, and a symbol counter connected to the tracking array,
    wherein the tracking array is configured to store hashes of a plurality of single-bit hypotheses, read a stored hash from each element of the tracking array, progress each read hash on each incoming bit, overwrite each stored hash in the array with each progressed hash, respectively, check, at the end of a packet, if any of the single-bit hypotheses hash elements in the tracking array is zero, and if not, make a plurality of corrections by computing at least one affine combination of the array hashes to correct a plurality of flipped bits based on the plurality of hashes,
    wherein the tracking array is further configured to check, at the end of a packet, if any of hashes of the plurality of single-bit hypotheses in the tracking array is zero, and if not, make a plurality of corrections by computing at least one affine combination of hashes of the tracking array to correct a plurality of flipped bits based on the hashes of the plurality of single-bit hypotheses, wherein the at least one affine combination of the hashes of the tracking array is a linear combination of hashes of the tracking array.

* * * * *